United States Patent
Kubota et al.

(10) Patent No.: US 8,393,071 B2
(45) Date of Patent: Mar. 12, 2013

(54) METHOD FOR MANUFACTURING AN OSCILLATOR DEVICE

(75) Inventors: Hajime Kubota, Kawasaki (JP);
Masayuki Itoh, Kawasaki (JP);
Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 73 days.

(21) Appl. No.: 13/073,292

(22) Filed: Mar. 28, 2011

(65) Prior Publication Data

US 2011/0302774 A1 Dec. 15, 2011

(30) Foreign Application Priority Data

Jun. 14, 2010 (JP) .................................. 2010-134906

(51) Int. Cl.
*H04R 31/00* (2006.01)
(52) U.S. Cl. ......... 29/594; 29/609.1; 333/202; 333/208; 333/212; 361/306.1; 438/48; 438/459
(58) Field of Classification Search .................. 29/25.42, 29/592.1, 594, 609.1; 333/150, 187, 193, 333/195, 196; 361/306.1; 438/48, 459
See application file for complete search history.

(56) References Cited

U.S. PATENT DOCUMENTS

| | | | | |
|---|---|---|---|---|
| 5,821,836 A | * | 10/1998 | Katehi et al. | 333/202 |
| 5,918,280 A | * | 6/1999 | Gang et al. | 73/504.12 |
| 7,145,416 B2 | * | 12/2006 | Mizuno | 333/186 |
| 8,278,802 B1 | * | 10/2012 | Lee et al. | 310/363 |
| 2005/0116794 A1 | | 6/2005 | Mizuno | |

FOREIGN PATENT DOCUMENTS

JP 3864952 B2 1/2007

* cited by examiner

*Primary Examiner* — Paul D Kim
(74) *Attorney, Agent, or Firm* — Westerman, Hattori, Daniels & Adrian, LLP

(57) ABSTRACT

An oscillator device manufacturing method includes: placing an oscillator provided with electrodes on a convex pedestal provided on an assembly table; arranging, on the assembly table, a frame member including an opening surrounded by a frame thereof and provided with electrode pads on the frame such that the opening is positioned at the pedestal; connecting the electrode pads to the electrodes of the oscillator placed on the pedestal via wires, while the frame member is arranged on the assembly table; removing the frame member from the assembly table together with the oscillator after the connecting, and bonding the frame member connected to the oscillator to a substrate. By using the method, the oscillator device including the oscillator suspended in air above the substrate can be efficiently manufactured. In stead of using the frame member, a frame body in which frame members are arrayed can be employed.

2 Claims, 16 Drawing Sheets

(PLACE OSCILLATOR ON SUBSTRATE)

(PULL UP AND HOLD OSCILLATOR)

(WIRE BONDING)

(STOP SUCTION)

(PLACE OSCILLATOR ON SUBSTRATE)

(PULL UP AND HOLD OSCILLATOR)

(WIRE BONDING)

(STOP SUCTION)

(PLACE SPACER ON SUBSTRATE)

(PLACE OSCILLATOR ON SPACER)

(WIRE BONDING)

(SUBLIME SPACER)

(SET INTAKE/BLAST PORT IN INTAKE STATE AND HOLD OSCILLATOR ON SUBSTRATE)

(WIRE BONDING)

(SET INTAKE/BLAST PORT IN BLAST STATE)

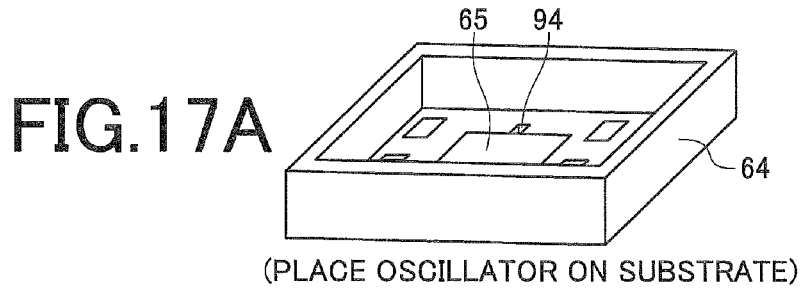
(PLACE OSCILLATOR ON SUBSTRATE)
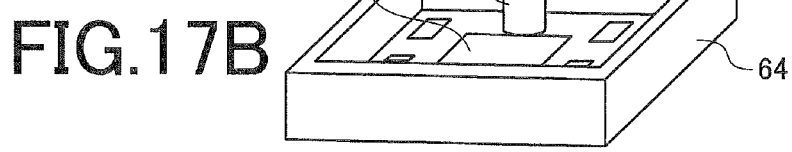
(SET INTAKE/BLAST PORT IN INTAKE STATE AND HOLD OSCILLATOR)
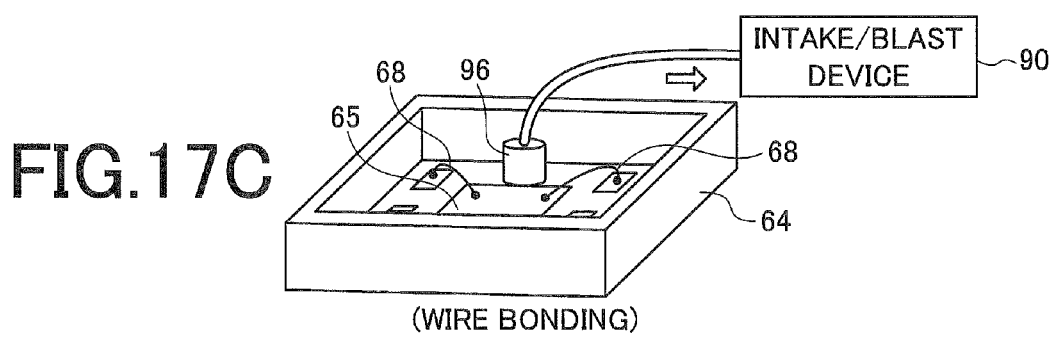
(WIRE BONDING)
(SET INTAKE/BLAST PORT IN BLAST STATE)
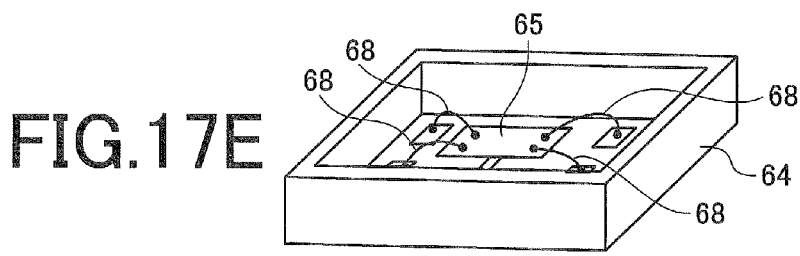
FIG.17A
FIG.17B
FIG.17C
FIG.17D
FIG.17E

METHOD FOR MANUFACTURING AN OSCILLATOR DEVICE

CROSS-REFERENCE TO RELATED APPLICATIONS

This application is based upon and claims the benefit of priority of the prior Japanese Patent Application No. 2010-134906, filed on Jun. 16, 2010, the entire contents of which are incorporated herein by reference.

FIELD

The present invention relates to a method for manufacturing an oscillator device including an oscillator suspended in air above a substrate by use of wires, and an oscillator device.

BACKGROUND

There is conventionally used an oscillator device including an oscillator as a sensor for various electronic devices such as personal computers or cell phones. An oscillator device of this type typically employs a structure in which various oscillators such as an AT oscillator, a tuning fork oscillator or an H-type oscillator are supported on a base and are electrically connected via a conductive adhesive.

Since the conductive adhesive has high adhesion, a failure may occur that the oscillator is fixed on the base and a degree of freedom for oscillating thereof is restricted in each direction, which limits oscillation, and an output frequency of the oscillator is unstable and thus the oscillator does not oscillate.

To the contrary, there is known an oscillator device having an oscillator supported on a base. In the oscillator device, the oscillator is connected to wires extending from the base via wire bonding and thus is supported in air with respect to the base, one of connection terminals provided on the oscillator is connected to connection ends of the wires, and at least some of the wires work as electric wirings electrically connected to the oscillator (see Japanese Patent No. 3864952).

For the oscillator device, when an oscillator device is manufactured, an adhesive material is first applied to the center of a support substrate and the oscillator is adhered to the support substrate. Next, terminals of the support substrate and terminals of the oscillator are connected to each other via wire bonding by wires and then the adhesive material is melted and removed. Thus, it is possible to obtain the oscillator device having a structure in which the oscillator is suspended in air with respect to the support substrate.

However, since the oscillator in the oscillator device is finally provided in a closed space surrounded by the support substrate, side surfaces and a ceiling, in the method using the adhesive material, foreign substances of the adhesive material remain in the closed space, which may influence the operation of the oscillator. Further, the processing in which the adhesive material is applied to the substrate and then the applied adhesive material is melted is complicated and thus the oscillator device may not be efficiently manufactured.

SUMMARY

According to an aspect of the invention, a method for manufacturing an oscillator device including an oscillator suspended in air above a substrate by use of wires, includes: placing an oscillator provided with electrodes on a convex pedestal provided on an assembly table; arranging, on the assembly table, a frame member including an opening surrounded by a frame thereof and provided with electrode pads on the frame such that the opening is positioned at the pedestal; connecting the electrode pads to the electrodes of the oscillator placed on the pedestal via wires, while the frame member is arranged on the assembly table; removing the frame member from the assembly table together with the oscillator after the connecting, and bonding the frame member connected to the oscillator to a substrate.

According to another aspect of the invention, a method for manufacturing oscillator devices, each oscillator device including an oscillator suspended in air above a substrate by use of wires, includes: placing oscillators provided with electrodes on a plurality of convex pedestals provided on an assembly table, respectively; arranging, on the assembly table, a frame body in which frame members are arrayed, the frame members having openings surrounded by frames thereof and provided with electrode pads on the frames such that the respective openings are positioned at the respective pedestals; connecting the electrode pads to the electrodes of the oscillators placed on the respective pedestals via wires, while the frame body is arranged on the assembly table; removing the frame body from the assembly table together with the oscillators after the connecting; cutting, in a unit of each of the frame members, the frame body connected to the oscillators into the frame members, each frame member connected to each of the oscillators; and bonding each of the frame members to a substrate.

According to still another aspect of the invention, a method for manufacturing an oscillator device including an oscillator suspended in air above a substrate by use of wires, includes: pulling up an oscillator provided with electrodes from a substrate by suctioning the oscillator by use of a suction device; connecting electrode pads provided on the substrate to the electrodes of the oscillator via wires, while the oscillator is pulled up; and stopping a suction by the suction device after the connecting.

According to still another aspect of the invention, a method for manufacturing an oscillator device including an oscillator suspended in air above a substrate by use of wires, includes: placing an oscillator provided with electrodes on a sublimable spacer placed on a substrate; connecting electrode pads provided on the substrate to the electrodes of the oscillator via wires, while the oscillator is placed on the spacer; and subliming the spacer after the connecting.

According to still another aspect of the invention, a method for manufacturing an oscillator device including an oscillator suspended in air above a substrate by use of wires, includes: placing an oscillator provided with electrodes on an intake/blast port provided on a substrate and holding the oscillator on the substrate by setting the intake/blast port to an intake state; connecting electrode pads provided on the substrate to the electrodes of the oscillator via wires, while the oscillator is placed on the intake/blast port; stopping an intake of the intake/blast port after the connecting.

According to still another aspect of the invention, an oscillator device includes: a substrate; a protruding member which protrudes on the substrate and comprises electrode pads on a protruding surfaces thereof; and an oscillator having electrodes and suspended in air above the substrate by use of wires which connects the electrodes of the oscillator and the electrode pads of the protruding members.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

Referring now to the attached drawings which form a part of this original disclosure:

FIGS. 17A to 17E are diagrams for explaining the method for manufacturing an oscillator device according to the modification of the fifth embodiment;

DESCRIPTION OF EMBODIMENTS

A method for manufacturing an oscillator device according to the present invention will be described below.

(First Embodiment)

Figure 1A:
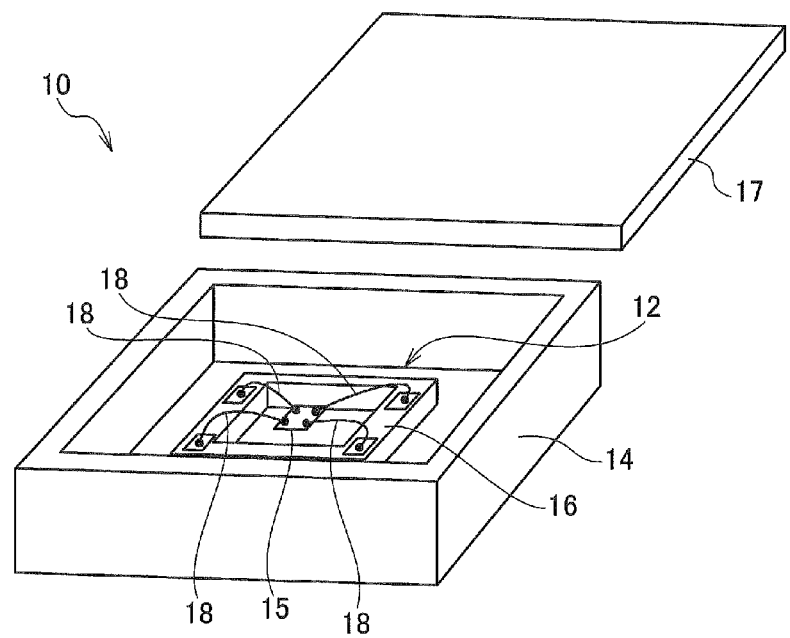
FIG. 1A is an exploded perspective view illustrating a schematic structure of an oscillator device manufactured by a method for manufacturing an oscillator device according to a first embodiment.
Figure 1B:
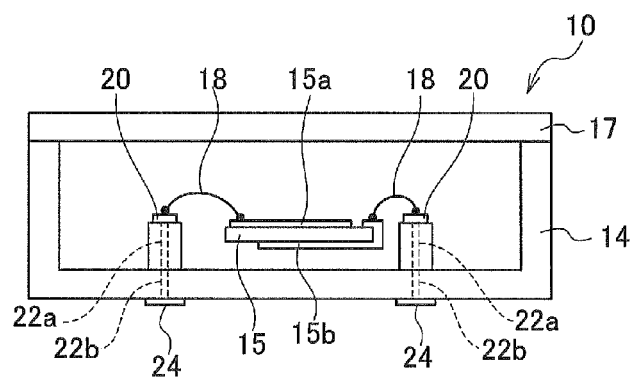
FIG. 1B is a diagram for explaining one section of the oscillator device illustrated in FIG. 1A.

FIG. 1A is an exploded perspective view illustrating a schematic structure of an oscillator device manufactured by a method for manufacturing an oscillator device according to a first embodiment. FIG. 1B is a diagram for explaining one section of the oscillator device illustrated in FIG. 1A.

The oscillator device 10 illustrated in FIG. 1A has an oscillator device main body (which will be called main body below) 12, a housing 14 and a top plate 17.

The housing 14 has a bottom and walls to surround the main body 12, and the main body 12 is bonded to the bottom of the housing 14 at a predetermined position. The bottom of the housing 14 is a support substrate to which the main body 12 is bonded.

The top plate 17 closes the ceiling portion of the housing 14 thereby to confine the main body 12 in a closed space. The housing 14 and the top plate 17 are made of ceramic material, for example.

As illustrated in FIG. 1B, the housing 14 is provided with via holes 22b and electrode terminals 24 connected to the via holes 22b. The electrode terminals 24 are provided on the backside of the support substrate (the bottom of the housing 14) on which the main body 12 is provided. As illustrated in FIG. 1B, the via holes 22b are connected to via holes 22a provided on the main body 12.

The main body 12 mainly includes an oscillator 15 and an external frame member 16.

The oscillator 15 employs a crystal oscillator, for example. The oscillator 15 includes an oscillator blank, and electrodes 15a, 15b provided on two main surfaces of the oscillator blank. Major part of the oscillator blank is sandwiched by the electrodes 15a and 15b. The ends of the electrodes 15a, 15b are connected to wires 18.

The external frame member 16 is formed to be square-shaped, has an opening at center thereof, and is provided on the support substrate. The external frame member 16 is a protruding member which protrudes on the surface of the support substrate and includes electrode pads 20 on the protruded surface. The external frame member 16 is bonded to the support substrate as the bottom of the housing 14. The electrode pads 20 of the external frame member 16 are connected to the via holes 22a and are electrically connected to the wires 18 while the wires 18 are connected to the electrodes 15a, 15b of the oscillator 15. In other words, the wires 18 are connection lines for electrically connecting between the electrode pads 20 and the electrodes 15a, 15b of the oscillator 15.

The oscillator 15 is suspended in air above the support substrate as the bottom of the housing 14 due to rigidity of the wires 18 extending from the external frame member 16. The external frame member 16 is bonded to the support substrate as the bottom of the housing 14 via pressure bonding by use of an adhesive or soldering or the like.

As described above, the oscillator device 10 is provided with the electrode pads 20 at a higher position than the support substrate, and the oscillator 15 is connected to the external frame member 16 via the wires 18 extending from the electrode pads 20. Thus, in the oscillator device 10, the oscillator 15 can be accurately suspended in air above the support substrate. Therefore, the oscillator device 10 can be efficiently manufactured so as to include an oscillator suspended in air above the substrate by use of wires.

The external frame member 16 may have a frame shape for surrounding the oscillator 15 or a shape in which part of the frame periphery is cut. The support substrate may be provided with, like the external frame member 16, members protruding from the support substrate such that the electrode pads 20 connected to the oscillator 15 via the wires are located at a higher position than the support substrate.

Figure 1C:
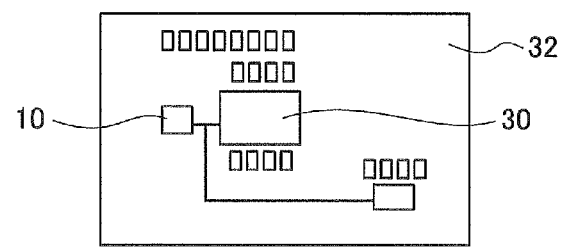
FIG. 1C is a diagram illustrating an example of a print wiring board having the oscillator device mounted thereon.

As illustrated in FIG. 1C, the oscillator device 10 is mounted on a print wiring board 32 together with a semiconductor package 30 including semiconductor chips and other electronic components via the connection between the electrode terminals 24 and mount pads provided on the print wiring board 32, thereby manufacturing a print wiring board unit. The manufactured print wiring board unit is incorporated in electronic devices or portable electronic devices such as personal computers, cell phones, GPS (Global Positioning System) devices and PDA (Personal Digital Assistant).

Figure 2:
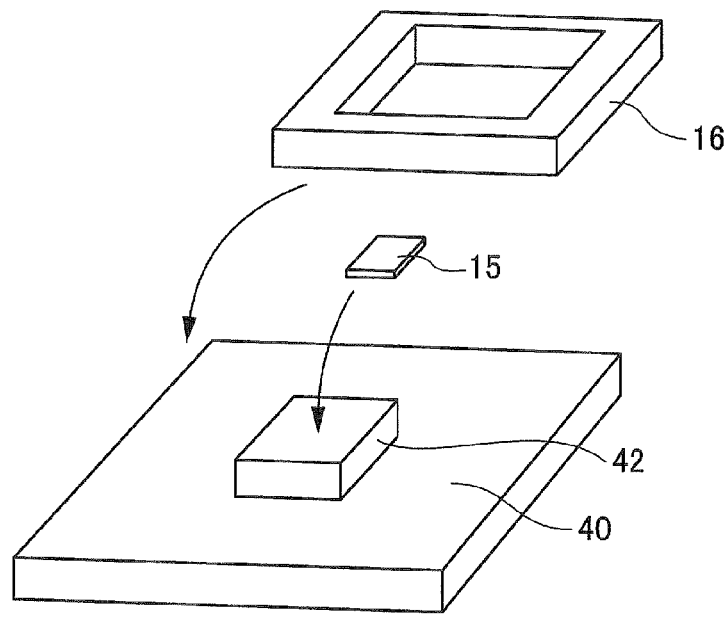
FIG. 2 is a diagram for explaining a step of the method for manufacturing an oscillator device according to the first embodiment.
Figure 3:
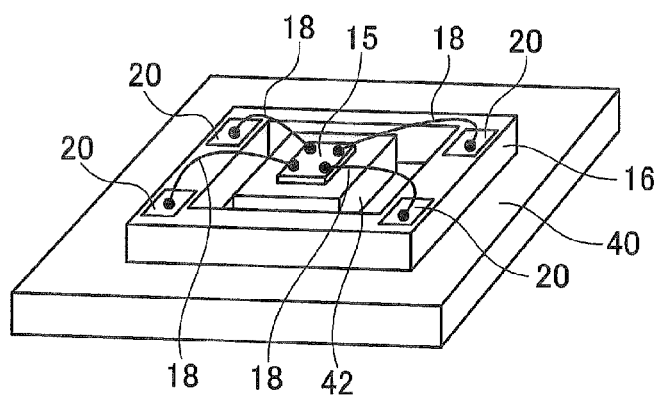
FIG. 3 is a diagram for explaining a step of the method for manufacturing an oscillator device according to the first embodiment.
Figure 4:
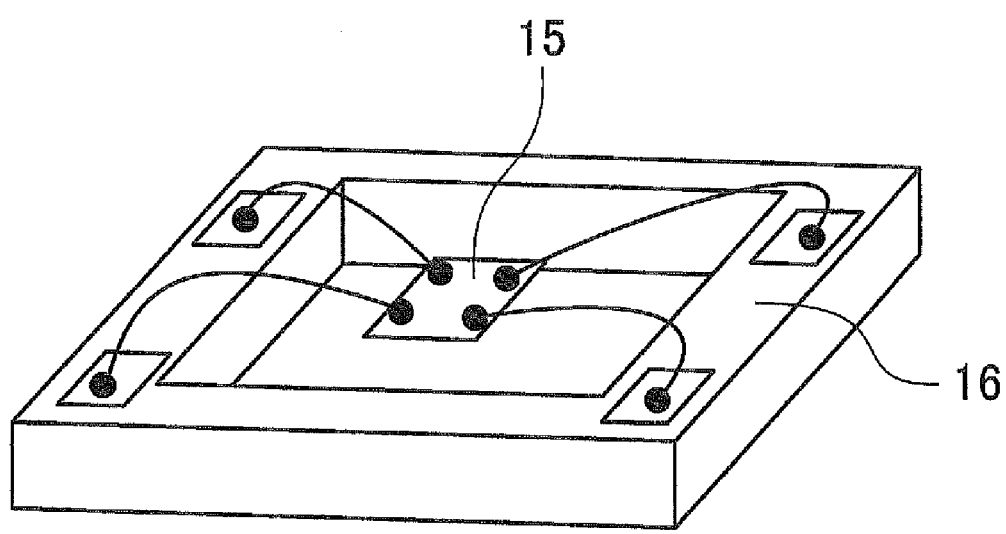
FIG. 4 is a diagram for explaining a step of the method for manufacturing an oscillator device according to the first embodiment.
Figure 5:
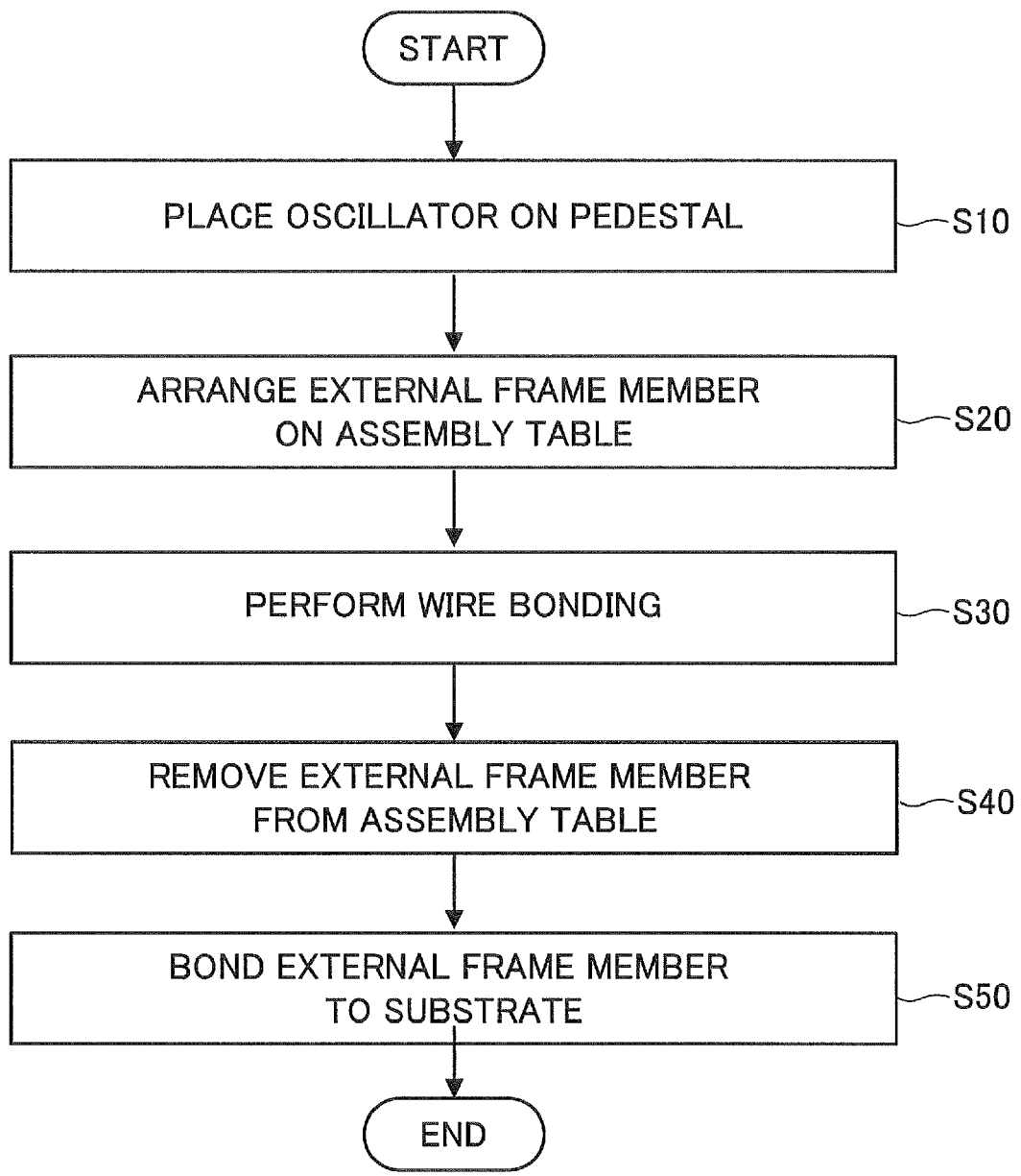
FIG. 5 is a flowchart of the method for manufacturing an oscillator device according to the first embodiment.

FIGS. 2 to 4 are diagrams for explaining the method for manufacturing the oscillator device 10 according to the first embodiment, and FIG. 5 is a flowchart of the method for manufacturing the oscillator device 10.

At first, as illustrated in FIG. 2, the oscillator 15 provided with the electrodes 15a and 15b are placed on top of a pedestal 42 of an assembly table 40 (step S10). The oscillator 15 is placed on the pedestal 42 by a carrier device (not illustrated).

The pedestal 42 is a convex table provided on the assembly table 40, and its top surface is plane. The assembly table 40 employs a metallic member, a ceramic member, a resin member or the like. The shape of the top surface of the pedestal 42 may be rectangular as illustrated in FIG. 2, and further may be circular, oval or polygonal.

Then, as illustrated in FIG. 2, the square-shaped external frame member 16 surrounding an opening therein is arranged on top of the assembly table 40 so as to surround the pedestal 42 (step S20). The external frame member 16 is arranged by the carrier device (not illustrated). In other words, the external frame member 16 is arranged on the assembly table 40 such that the opening of the external frame member 16 is positioned at the pedestal 42 and the frame surrounds the pedestal 42. The external frame member 16 has the opening surrounded by the frame but part of the periphery of the external frame may be cut. The external frame member 16 may have any shape other than the square shape, and the external frame member 16 may be provided with an opening surrounding the pedestal 42.

The height of the top surface of the external frame member 16 arranged on the assembly table 40 is preferably set to be lower than the height of the pedestal 42 for efficient wire bonding described later. In other words, the oscillator 15 mounted on the pedestal 42 is preferably located at a higher position than the top surface of the external frame member 16 arranged on the assembly table 40.

The external frame member 16 is arranged on the assembly table 40 after the oscillator 15 is placed on the pedestal 42, while the oscillator 15 may be placed on the pedestal 42 after the external frame member 16 is arranged on the assembly table 40.

Next, wire bonding is performed by use of wire bonders (not illustrated) (step S30). Specifically, the assembly table 40 having the external frame member 16 and the oscillator 15 mounted thereon is placed on a bonding stage. Thereafter, the wires 18 are connected between the ends of the electrodes 15a, 15b of the oscillator 15 and the electrode pads 20 provided on top of the frame of the external frame member 16 by the wire bonders, whereby the electrodes 15a, 15b are electrically connected to the electrode pads 20.

By use of the wire bonding, the electrodes 15a, 15b of the oscillator 15 are first connected to the wires 18 and then are connected to the electrode pads 20 of the external frame member 16. When the electrode pads 20 of the external frame member 16 are first connected to the wires 18 and then the wires 18 are connected to the electrodes 15a, 15b, the wire bonders hold the wires 18 connected to the electrode pads 20 and press the tip ends of the wires 18 against the electrodes 15a, 15b. The pressing force may cause the tip ends of the wires 18 to damage the oscillator 15. Thus, the ends of the electrodes 15a, 15b of the oscillator 15 are first connected to the wires 18 and then are connected to the electrode pads 20 of the external frame member 16.

As described above, the height of the electrodes 15a, 15b of the oscillator 15 placed on the pedestal 42 from the assembly table 40 is preferably larger than the height of the electrode pads 20 of the external frame member 42 from the assembly table 40. This is because the wire bonders smoothly move by allowing the wire bonders to move from the higher position to the lower position while holding the wires. In this manner, as illustrated in FIG. 3, the ends of the electrodes 15a, 15b at the corners of the oscillator 15 are connected to the electrode pads 20. In the present embodiment, the oscillator 15 is connected to the external frame member 16 via four wires 18 but two, three or five wires may be employed and the number of connected wires 18 is not limited.

Next, the external frame member 16 which is wire-bonded to the oscillator 15 is removed from the assembly table 40 (step S40). The external frame member 16 is removed from the assembly table 40 by the carrier device (not illustrated). In this way, the external frame member 16 which is wire-bonded to the oscillator 15 as illustrated in FIG. 4 is manufactured. Next, the bottom of the external frame member 16 which is wire-bonded to the oscillator 15 is bonded to the support substrate as the bottom of the housing 14 via soldering or pressure bonding (step S50). At this time, as illustrated in FIG. 1B, the via holes 22a and the via holes 22b are positioned to be mutually connected, and are bonded to each other. Thereafter, the top plate 17 is bonded to the top side of the housing 14 and the main body 12 is confined in the closed space. The oscillator device 10 is manufactured as described above.

In this way, the oscillator 15 is electrically connected to the electrode pads 20 provided on top of the external frame member 16 via the wires 18 extending from the electrode pads 20, and additionally is suspended by the wires 18. Thus, the oscillator 15 is suspended in air and floating above the support substrate as the bottom of the housing 14.

In the present embodiment, the external frame member 16 having the square shape to surround the pedestal 42 is arranged on the assembly table 40, the electrode pads 20 provided on the external frame member 16 arranged on the assembly table 40 are connected to the electrodes 15a, 15b provided on the oscillator 15 via the wires 18, and then the external frame member 16 is removed from the assembly table 40. Thus, unlike the conventional manufacturing method, since there are no complicated steps of adhering the oscillator by an adhesive and melting the adhesive, the oscillator device 10 having the oscillator 15 suspended in air and floating above the support substrate as the bottom of the housing 14 can be easily and efficiently manufactured.

Further, unlike the conventional manufacturing method, a failure does not occur that the adhesive remains in the closed space surrounded by the housing 14 and the top plate 17, which adversely affects the operation of the oscillator 15.

(Second Embodiment)

Figure 7:
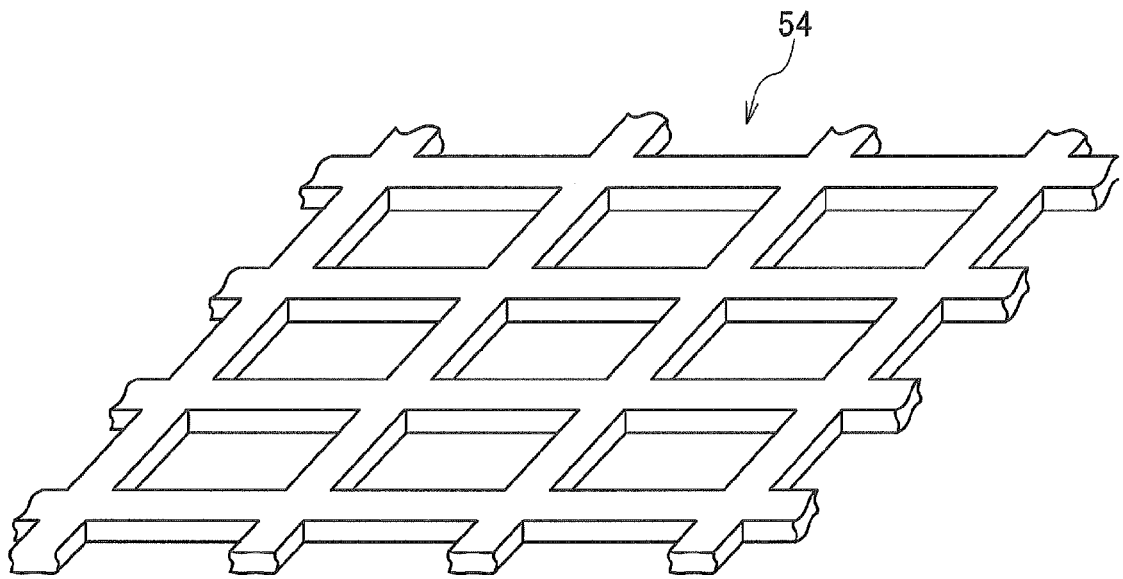
FIG. 7 is a diagram for explaining a step of the method for manufacturing an oscillator device according to the second embodiment.
Figure 7:
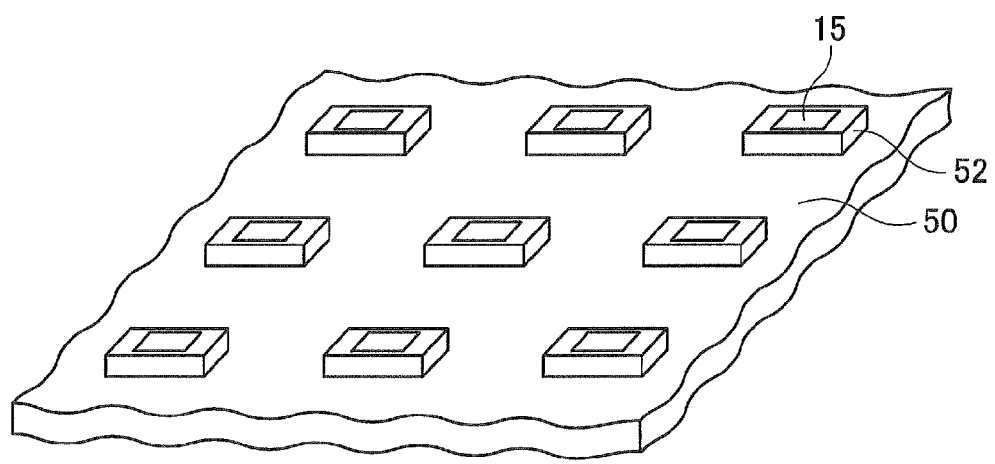
Figure 8:
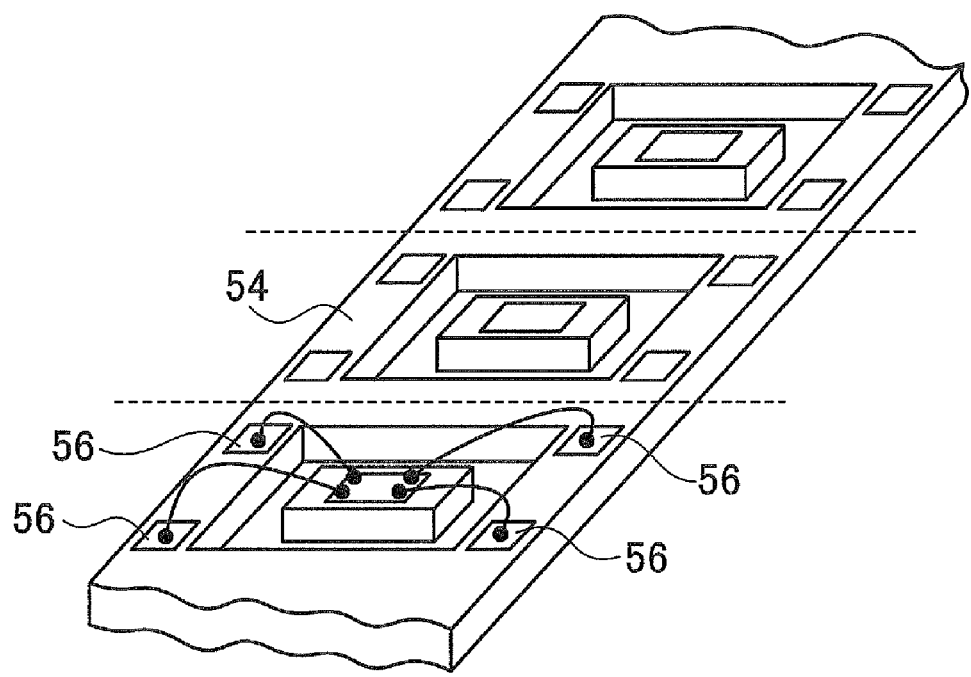
FIG. 8 is a diagram for explaining a step of the method for manufacturing an oscillator device according to the second embodiment.
Figure 9:
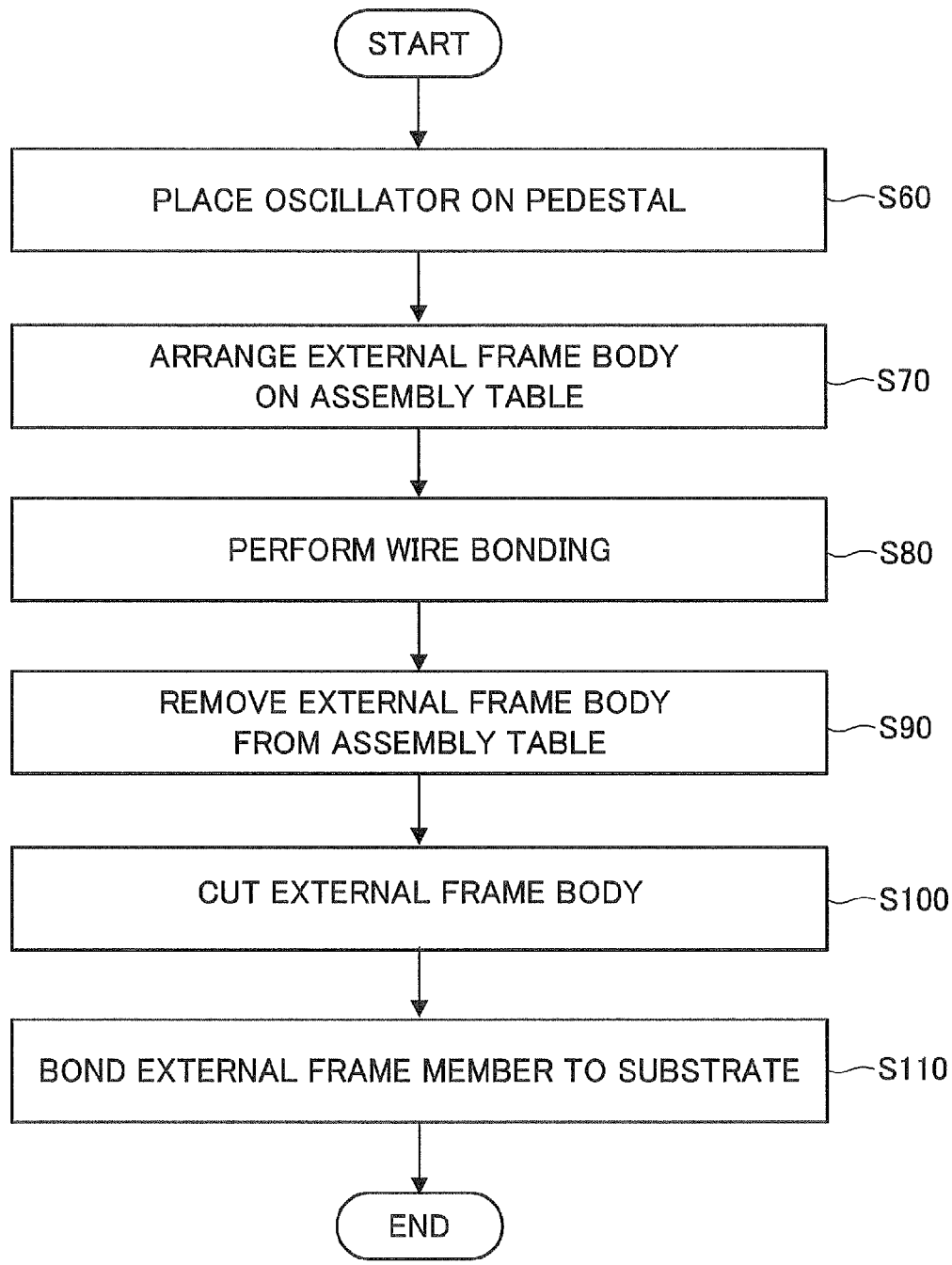
FIG. 9 is a flowchart of the method for manufacturing an oscillator device according to the second embodiment.

FIG. 6A, FIG. 6B, FIG. 7 and FIG. 8 are diagrams for explaining a method for manufacturing an oscillator device according to a second embodiment. FIG. 9 is a flowchart of the manufacturing method according to the second embodiment.

The oscillator device 10 illustrated in FIG. 1A and FIG. 1B is manufactured by the manufacturing method according to the second embodiment.

Specifically, in the oscillator device 10 manufactured according to the second embodiment, the main body 12 is provided inside the housing 14. In the main body 12, the oscillator 15 is connected to the external frame member 16 via the wires 18 used for electric connection and the oscillator 15 is suspended by the wires 18 extending from the external frame member 16. Thereby, the oscillator 15 is suspended in air and floating above the support substrate. The manufacturing method according to the second embodiment is directed for efficiently manufacturing many oscillator devices 10.

Figure 6A:
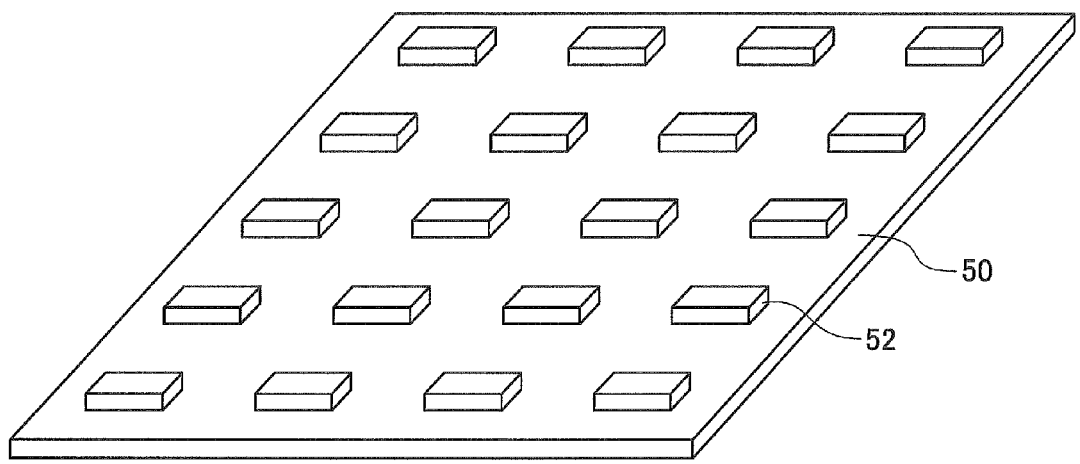
FIGS. 6A and 6B are diagrams, each diagram explaining a step of a method for manufacturing an oscillator device according to a second embodiment.
Figure 6B:
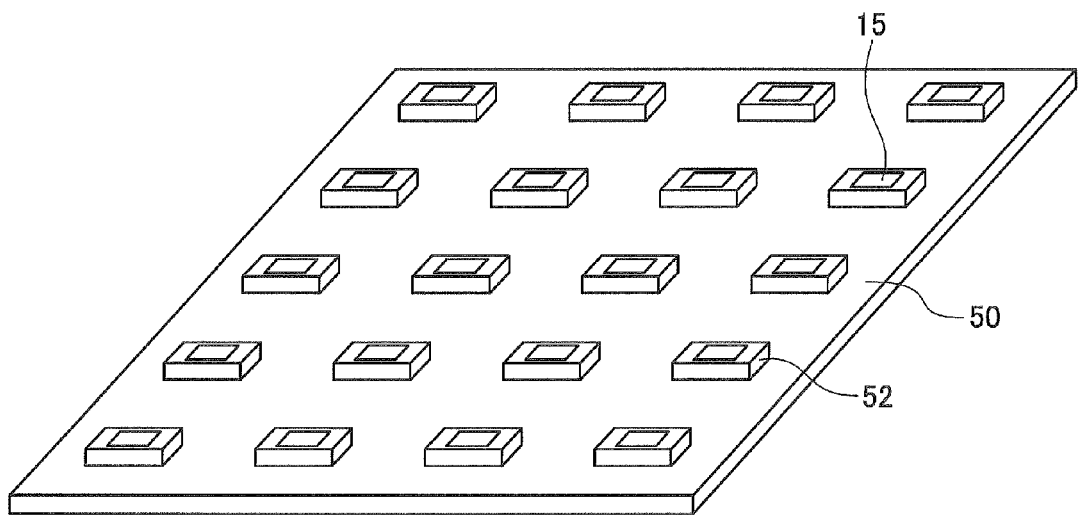

First, an assembly table 50 is prepared. On the assembly table 50, a plurality of convex pedestals 52 are provided as illustrated in FIG. 6A. As illustrated in 6B, the oscillator 15 provided with the electrodes 15a, 15b as illustrated in FIG. 1B is placed on each of the pedestals 52 (step S60). The oscillator 15 is placed on each of the pedestal 52 by the carrier device (not illustrated). The pedestals 52 are uniformly provided on the assembly table 50 at a certain interval. The each of convex pedestal 52 provided on the assembly table 50 has the plane top surface. The assembly table 50 employs a metallic member, a ceramic member, a resin member or the like.

Next, as illustrated in FIG. 7, an external frame body 54 having square grating shapes for surrounding the respective pedestals 52 is arranged on the assembly table 50 (step S70). The external frame body 54 is arranged by the carrier device (not illustrated). The external frame body 54 is a collection of the external frame members 16 in which the square-shaped external frame members 16 having the opening surrounded by the external frame are uniformly arrayed. The respective openings of the external frame body 54 are positioned corresponding to the respective pedestals 52 and the external frame body 54 is arranged such that the frames in the external frame body 54 surround the respective pedestals 52. Electrode pads 56 (see FIG. 8) are provided on top of the frames of the external frame members 16 of the external frame body 54.

The height of the top surface of the external frame body 54 arranged on the assembly table 50 is preferably set to be lower than the height of the pedestals 52 for efficiently wire bonding. In other words, the oscillator 15 placed on the pedestal 52 is preferably at a higher position than the frame surface of the external frame body 54 arranged on the assembly table 50.

The external frame body 54 is arranged on the assembly table 50 after the oscillators 15 are placed on the pedestals 52, but the oscillators 15 may be placed on the pedestals 52 after the external frame body 54 is arranged on the assembly table 50.

Next, the wire bonding is performed on the respective oscillators 15 by use of wire bonders (not illustrated) (step S80). Specifically, the assembly table 50 on which the external frame body 54 and the oscillators 15 are placed is placed on a bonding stage. Thereafter, as illustrated in FIG. 8, the wires 18 are connected between the ends of the electrodes 15a, 15b of the oscillator 15 and the electrode pads 56 provided on the surface corresponding to the external frame member of the external frame body 54 via the wire bonders so that the electrodes 15a, 15b are electrically connected to the electrode pads 56. The electrode pads 56 correspond to the electrode pads 20 illustrated in FIG. 1B, FIG. 1 and FIG. 3.

Like the first embodiment, the ends of the electrodes 15a, 15b of the oscillator 15 are first connected to the wires 18 and then are connected to the electrode pads 56 of the external frame member 16 via the wire bonding.

In this way, the ends of the electrodes at the corners of the oscillator 15 are connected to the electrode pads 56 as illustrated in FIG. 8. In the second embodiment, each oscillator 15 is connected to the external frame body 54 via four wires 18 but two, three or five wires may be employed and the number of wires is not limited.

Next, the external frame body 54 having the oscillators 15 wire-bonded thereto is removed from the assembly table 50 (step S90). The external frame body 54 is removed by the carrier device (not illustrated).

Next, the external frame body 54 is carried to a dicing device by the carrier device and is cut by a dicing saw at broken lines indicated in FIG. 8 (step S100). The cutting position is between the openings on the external frame body 54, that is, a boundary position of the external frame member 16 illustrated in FIG. 4 which is one of units in the external frame body 54. The external frame body 54 is cut in this manner so that a plurality of external frame members 16 in which the oscillator 15 is suspended by the wires 18 as illustrated in FIG. 4 are manufactured.

Next, the bottom of the external frame member 16 having the oscillator 15 wire-bonded thereto is bonded to the support substrate as the bottom of the housing 14 via soldering or pressure bonding (step S110). At this time, as illustrated in FIG. 1B, the via holes 22a and the via holes 22b are positioned to be mutually connected, and are bonded to each other.

Thereafter, the top plate 17 is bonded to the top side of the housing 14 and the main body 12 is confined in the closed space. The oscillator device 10 is manufactured as described above.

In the second embodiment, since the external frame body 54 in which the external frame members 16 used for the first embodiment are arrayed is wire-bonded to the oscillators 15, a large number of oscillator devices 10 can be efficiently manufactured. Unlike the conventional manufacturing method, since there are no complicated steps of bonding the oscillator by an adhesive and melting the adhesive, the oscillator device 10 including the oscillator 15 suspended in air and floating above the support substrate can be easily and efficiently manufactured. Further, unlike the conventional manufacturing method, a failure does not occur that the adhesive remains in the closed space surrounded by the housing 14 and the top plate 17, which adversely affects the operation of the oscillator 15.

(Third Embodiment)

Figure 10:
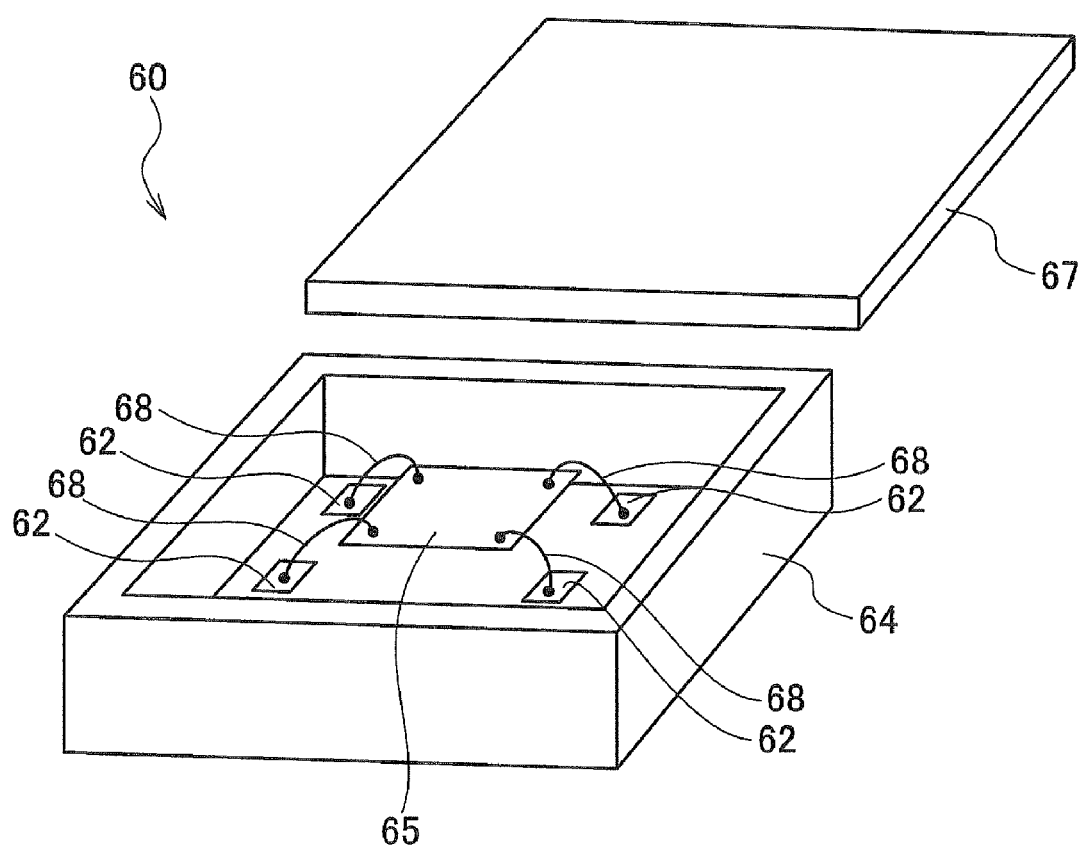
FIG. 10 is an exploded perspective view illustrating a schematic structure of an oscillator device manufactured by a method for manufacturing an oscillator device according to a third embodiment.

FIG. 10 is an exploded perspective view illustrating a schematic structure of an oscillator device 60 manufactured by a method for manufacturing an oscillator device according to a third embodiment of the. Unlike the oscillator device 10 illustrated in FIG. 1B, the oscillator device 60 illustrated in FIG. 10 is not provided with the external frame member 16, and electrode pads 62 provided on the support substrate as the bottom of a housing 64 are connected to the ends of the electrodes provided on the main surface of the oscillator 65 via wires 68. The oscillator 65 is suspended in air and floating above the support substrate of the housing 64 due to rigidity of the wires 68. In other words, the oscillator 65 is suspended by the wires 68 used for electric connection. The electrode pads 62 provided on the support substrate of the housing 64 are connected, through via holes (not illustrated), to the electrodes provided on the backside of the surface on which the oscillator 65 is provided, like the electrode terminals 24 illustrated in FIG. 1B. The ceiling of the housing 64 is bonded to a top plate 67 and the oscillator 65 is provided to be confined in the housing 64 while suspended in air and floating above the support substrate.

The electrodes of the oscillator 65 are will not be described in FIG. 10.

FIGS. 11A to 11D are diagrams for simplifying and explaining the method for manufacturing the oscillator device 60.

Figure 11A:
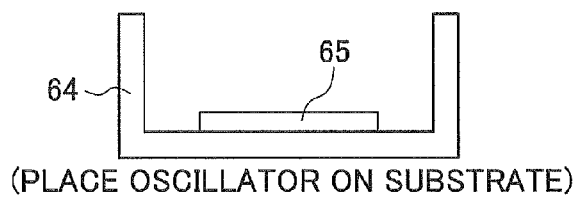
FIGS. 11A to 11D are diagrams for explaining the method for manufacturing an oscillator device according to the third embodiment.

At first, as illustrated in FIG. 11A, the oscillator 65 whose electrodes are provided on the main surface of an oscillator blank is placed on the support substrate as the bottom of the housing 64.

Figure 11B:
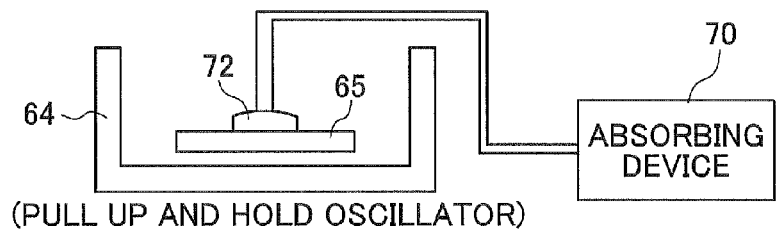

Thereafter, as illustrated in FIG. 11B, the oscillator 65 is pulled up by a suction force caused by an intake air from an absorbing nozzle 72 of an absorbing device 70 and is held in this state. The absorbing nozzle 72 is held at its position by a stand (not illustrated).

Figure 11C:
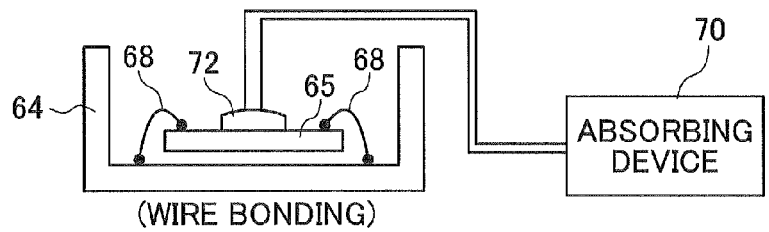

When this state is being held, the wire bonding is performed as illustrated in FIG. 11C, by use of wire bonders. For the wire bonding, the electrodes of the oscillator 65 are connected to the wires 68 and then the electrode pads 62 (see FIG. 10) provided on the support substrate of the housing 64 are connected to the wires 68. If the electrodes of the oscillator 65 are connected to the wires 68 after the support substrate of the housing 64 is connected to the wires 68, it is difficult to press the tip ends of the wires 68 against the electrodes of the oscillator 65 for connection since the oscillator 65 is only pulled up and held by the absorbing nozzle 72.

Figure 11D:
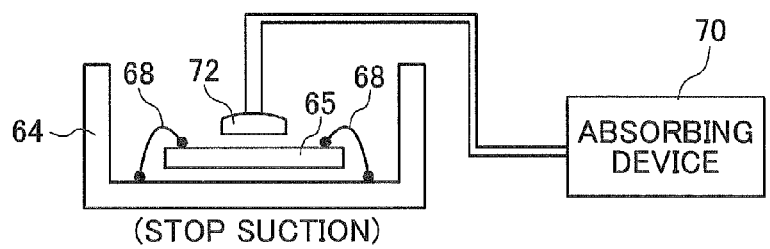

When the wire bonding is finished, the suction by the absorbing device 70 is stopped as illustrated in FIG. 11D. When the suction is stopped, the oscillator 65 is suspended in air and floating above the support substrate of the housing 64 due to rigidity of the wires 68.

In this way, in the present embodiment, the oscillator 65 is pulled up and held from the support substrate of the housing 64, and the electrodes of the oscillator 65 are wire-bonded to the electrode pads 62 (see FIG. 10) on the support substrate in the held state. Therefore, unlike the conventional manufacturing method, there are no complicated steps of bonding the oscillator by an adhesive and melting the adhesive, and thus the oscillator device 60 including the oscillator 65 suspended in air and floating above the support substrate can be easily and efficiently manufactured. Further, a failure does not occur that the adhesive remains in the closed space surrounded by the housing 64 and the top plate 67, which adversely affects the operation of the oscillator 65.

(Modification of Third Embodiment)

In the third embodiment, when the oscillator device 60 illustrated in FIG. 10 is manufactured, the suction by an intake air is used for pulling up and holding the oscillator 65 from the support substrate as the bottom of the housing 64, but in a modification, an attraction force by a magnet is used. FIGS. 12A to 12D are diagrams for explaining a method for manufacturing an oscillator device according to the modification.

Figure 12A:
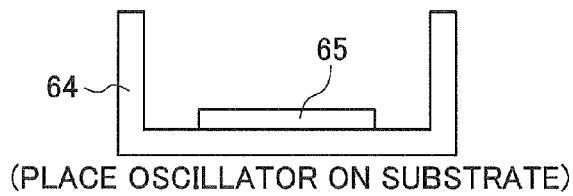
FIGS. 12A to 12D are diagrams for explaining a method for manufacturing an oscillator device according to a modification of the third embodiment.

At first, as illustrated in FIG. 12A, the oscillator 65 whose electrodes are provided on the main surface of the oscillator blank is placed on the support substrate as the bottom of the housing 64.

Figure 12B:
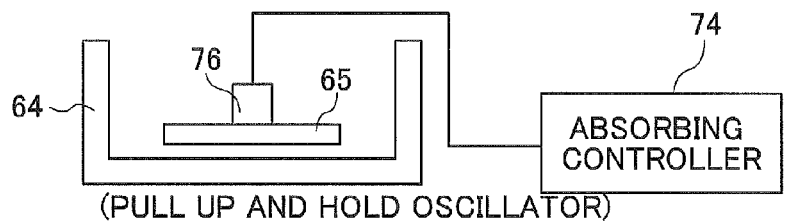

Thereafter, as illustrated in FIG. 12B, an electric magnet 76 is operated via an absorbing controller 74 and the oscillator 65 is pulled up and held by an attraction force of the electric magnet 76. The electrodes provided on the main surface of the oscillator 65 employ a material such as alloy of nickel and gold. The oscillator 65 is pulled up by the electric magnet 76 due to the ferromagnetic characteristics of the nickel.

Figure 12C:
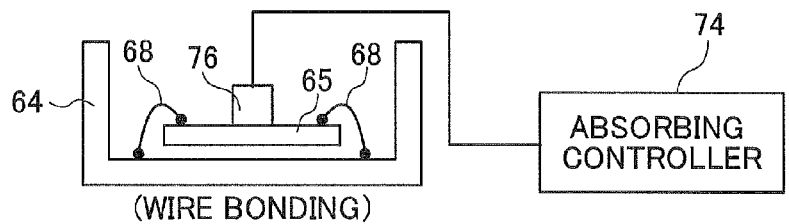
Figure 12D:
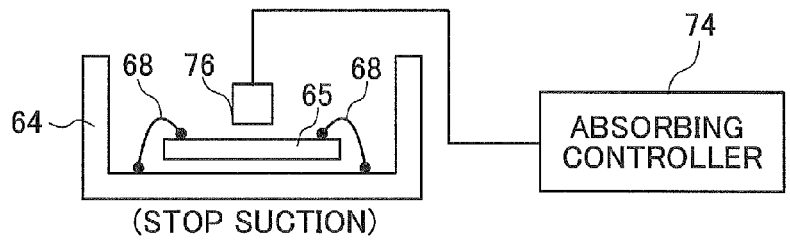

When this state is being held, the wire bonding is performed by the wire bonders as illustrated in FIG. 12C. For the wire bonding, the electrodes of the oscillator 65 are connected to the wires 68 and then the electrode pads 62 (see FIG. 10) provided on the support substrate of the housing 64 are connected to the wires 68. If the electrodes of the oscillator 65 are connected to the wires 68 after the support substrate of the housing 64 is connected to the wires 68, it is difficult to press the tip ends of the wires 68 against the electrodes of the oscillator 65 for connection since the oscillator 65 is only pulled up and held by the electric magnet 76.

When the wire bonding is finished, the absorbing controller 74 stops the operation of the electric magnet 76 as illustrated in FIG. 12B. When the suction is stopped, the oscillator 65 is suspended in air and floating above the support substrate of the housing 64 due to rigidity of the wires 68.

In this manner, also in the modification, the oscillator 65 is pulled up and held from the support substrate of the housing 64, and the electrodes of the oscillator 65 are wire-bonded to the electrode pads 62 on the support substrate in this held state. Therefore, unlike the conventional manufacturing method, there are no complicated steps of bonding the oscillator by an adhesive and melting the adhesive, and thus the oscillator device 60 including the oscillator 65 suspended in air and floating above the support substrate can be easily and efficiently manufactured. Further, a failure does not occur that the adhesive remains in the closed space surrounded by the housing 64 and the top plate 67, which adversely affects the operation of the oscillator 65.

(Fourth Embodiment)

In a fourth embodiment of the method for manufacturing an oscillator device, the oscillator device 60 illustrated in FIG. 10 is manufactured.

In the oscillator device 60, the electrode pads 62 provided on the support substrate as the bottom of the housing 64 are connected to the ends of the electrodes provided on the main surface of the oscillator 65 via the wires 68. The oscillator 65 is suspended in air and floating above the support substrate of the housing 64 due to rigidity of the wires 68. In other words, the oscillator 65 is suspended by the wires 68 used for electric connection. The electrode pads 62 provided on the support substrate of the housing 64 are connected, through via holes (not illustrated), to the electrodes provided on the backside of the surface on which the oscillator 65 is provided, as like the electrode terminals 24 illustrated in FIG. 1B. The ceiling of the housing 64 is bonded to the top plate 67 and the oscillator 65 is provided to be confined in the housing 64 while suspended in air and floating above the support substrate.

FIGS. 13A to 13D are diagrams for explaining the flow of the method for manufacturing an oscillator device according to the fourth embodiment.

Figure 13A:
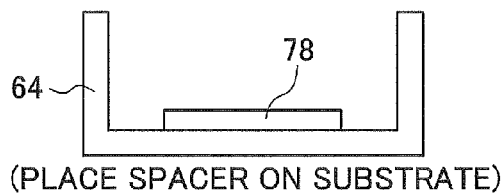
FIGS. 13A to 13D are diagrams for explaining a flow of a method for manufacturing an oscillator device according to a fourth embodiment.

At first, as illustrated in FIG. 13A, a spacer 78 is placed on a position where the oscillator 65 is scheduled to be placed by the carrier device. The spacer 78 employs a sublimable material such as dry ice formed in a predetermined shape.

Figure 13B:
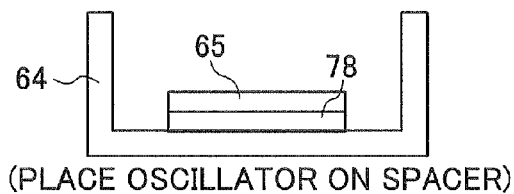

Next, as illustrated in FIG. 13B, the oscillator 65 whose electrodes are provided on the main surface of the oscillator blank are placed on the spacer 78 by the carrier device.

Figure 13C:
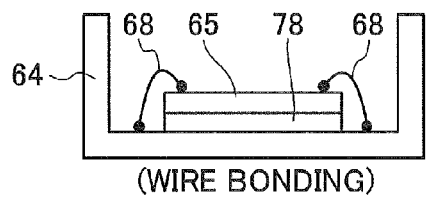
Figure 13D:
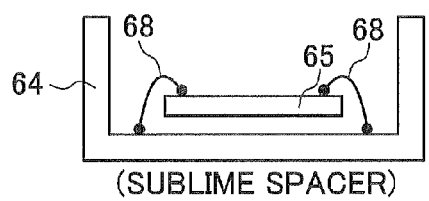

Thereafter, as illustrated in FIG. 13C, the wire bonding is performed by the wire bonders. For the wire bonding, the electrodes of the oscillator 65 are connected to the wires 68 and then the electrode pads 62 are connected to the wires 68. When the wire bonding is finished, the spacer 78 is sublimed as illustrated in FIG. 13D. The various subliming step are employed depending on the material nature of the spacer 78. When dry ice is used, the spacer 78 can be sublimed by a heating process not influencing the characteristics of the oscillator 65. The spacer 78 dissipates due to the sublimation of the spacer 78. At this point, the oscillator 65 gets suspended in air and floating above the support substrate of the housing 64 due to rigidity of the wires 68.

In this way, also in the fourth embodiment, the electrodes of the oscillator 65 are wire-bonded to the electrode pads 62 on the support substrate while the oscillator 65 is being held at a higher position than the support substrate of the housing 64. Therefore, unlike the conventional manufacturing method, there are no complicated steps of bonding the oscillator by an adhesive and melting the adhesive, and thus the oscillator device 60 including the oscillator 65 suspended in air and floating above the support substrate can be easily and efficiently manufactured. Since the spacer 78 is sublimed, a failure does not occur that the adhesive remains in the closed space surrounded by the housing 64 and the top plate 67, which adversely affects the operation of the oscillator 65.

(Fifth Embodiment)

In a fifth embodiment of the method for manufacturing an oscillator device, the oscillator device 60 illustrated in FIG. 10 is manufactured.

In the oscillator device 60, the electrode pads 62 provided on the support substrate as the bottom of the housing 64 are connected to the ends of the electrodes provided on the main surface of the oscillator 65 by the wires 68. The oscillator 65 is suspended in air and floating above the support substrate of the housing 64 due to rigidity of the wires 68. In other words, the oscillator 65 is suspended in air by the wires 68 used for electric connection. The electrode pads 62 provided on the support substrate of the housing 64 are connected, through via holes (not illustrated), to the electrodes provided on the backside of the surface on which the oscillator 65 is provided, like the electrode terminals 24 illustrated in FIG. 1B. The ceiling of the housing 64 is bonded to the top plate 67 and the oscillator 65 is provided to be confined in the housing 64 while suspended in air and floating above the support substrate.

Figure 14A:
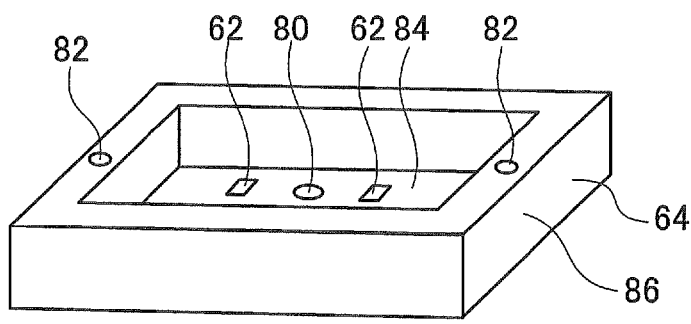
FIGS. 14A and 14B are diagrams illustrating an example of a housing used for a method for manufacturing an oscillator device according to a fifth embodiment.
Figure 14B:
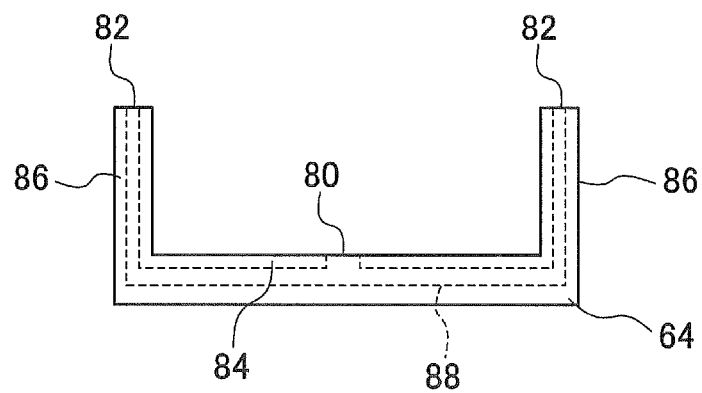

The housing 64 having an intake/blast port 80 as illustrated in FIG. 14A and FIG. 14B is used in the oscillator device 60 manufactured according to the fourth embodiment. The intake/blast port 80 is provided at a position where the oscillator 65 is scheduled to be placed on a support substrate 84 as the bottom of the housing 64. In other words, the intake/blast port 80 is provided substantially at the center of the four electrode pads 62.

The intake/blast port 80 of the housing 64 is provided with a conduit 88 passing through the support substrate 84 of the housing 64 and the edges 86 of the support substrate 84 so as to be connected to the openings 82 provided on the top surfaces of the edges forming the sidewalls of the housing 64. The openings 82 are not limited to being provided on the top of the edges forming the sidewalls of the housing 64. The openings 82 may be provided at any position of the housing 64 connectable to nozzles 92.

FIGS. 15A to 15D are diagrams for explaining the method for manufacturing the oscillator device 60 according to the fifth embodiment.

Figure 15A:
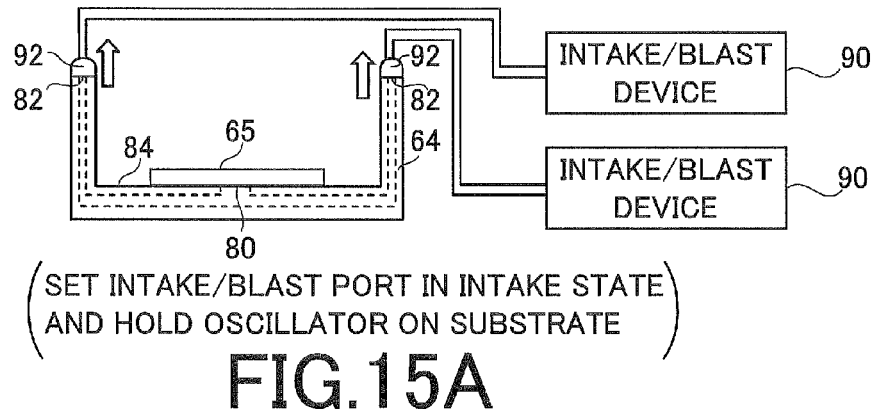
FIGS. 15A to 15D are diagrams for explaining the method for manufacturing an oscillator device according to the fifth embodiment.

At first, as illustrated in FIG. 15A, the oscillator 65 whose electrodes are provided on the main surface of the oscillator blank is placed on the support substrate 84 as the bottom of the housing 64. The oscillator 65 is placed on the support substrate 84 to cover the intake/blast port 80 from above. Further, the nozzles 92 of the intake/blast ports 90 are connected to the openings 82 and the intake/blast ports 80 gets into the intake state through the openings 82. Thus, the oscillator 65 is absorbed and held on the support substrate 84.

Figure 15B:
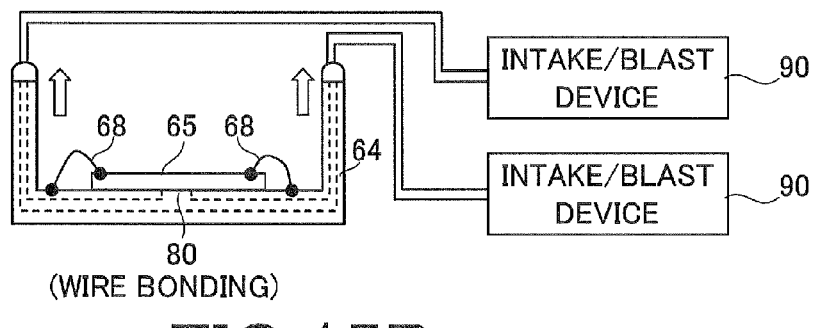

When the state is kept, the wire bonding is performed as illustrated in FIG. 15B, via the wire bonders. For the wire bonding, the electrodes of the oscillator 65 are connected to the wires 68 and then the electrode pads 62 of the support substrate 84 of the housing 64 are connected to the wires 68. If the electrodes of the oscillator 65 are connected to the wires 68 after the support substrate of the housing 64 is connected to the wires 68, the oscillator 65 may be damaged when the wire bonders holding the wires 68 press the tip ends of the wires 68 against the oscillator 65. Thus, after the electrodes of the oscillator 65 are connected to the wires 68, the electrode pads 62 on the support substrate of the housing 64 are connected to the wires 68.

Figure 15C:
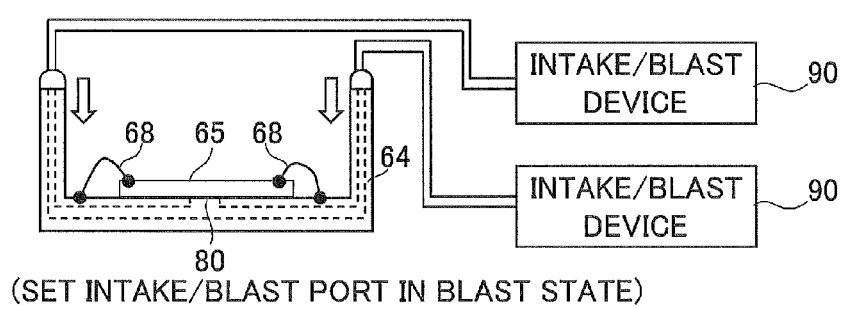
Figure 15D:
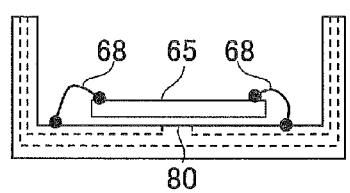

After the wire bonding is finished, the intake/blast device 90 stops the intake state of the intake/blast ports 80 and sets the intake/blast ports 80 in the blast state as illustrated in FIG. 15C. The intake/blast ports 80 are in the blast state in this manner because the oscillator 65 is wire-bonded to the support substrate 84 in the absorbed state and thus the oscillator 65 may not move up above the support substrate 84 due to rigidity of the wires 68 after the intake state of the intake/blast ports 80 is stopped. Thus, the intake/blast ports 80 are in the blast state so that the oscillator 65 accurately moves up and floats above the support substrate 84 as illustrated in FIG. 15D. In the present embodiment, as illustrated in FIG. 15C, the intake/blast ports 80 are finally set to the blast state but may not always be set to the blast state when the oscillator 65 moves up and gets suspended in air above the support substrate 84 before the blast state. However, the intake/blast ports 80 are preferably set to the blast state for the oscillator 65 to accurately move up and get suspended in air above the support substrate 84.

In this manner, in the fifth embodiment, the oscillator 65 is placed on the intake/blast port 80 of the support substrate 84 so that the oscillator 65 is held while the intake/blast ports 80 are in the intake state, and the wire bonding is performed while the oscillator 65 is held. Thereafter, the intake of the intake/blast ports 80 is stopped. Thus, unlike the conventional manufacturing method, there are no complicated steps of bonding the oscillator by an adhesive and melting the adhesive, and thus the oscillator device 60 including the oscillator 65 suspended in air and floating above the support substrate as the bottom of the housing 64 can be easily and efficiently manufactured. Further, a failure does not occur that the adhesive remains in the closed space surrounded by the housing 64 and the top plate 67, which adversely affects the operation of the oscillator 65.

The intake state of the intake/blast ports 80 is stopped and then the blast state is set so that the oscillator 65 can accurately move up and get suspended in air above the support substrate 84.

(Modification of Fifth Embodiment)

Figure 16:
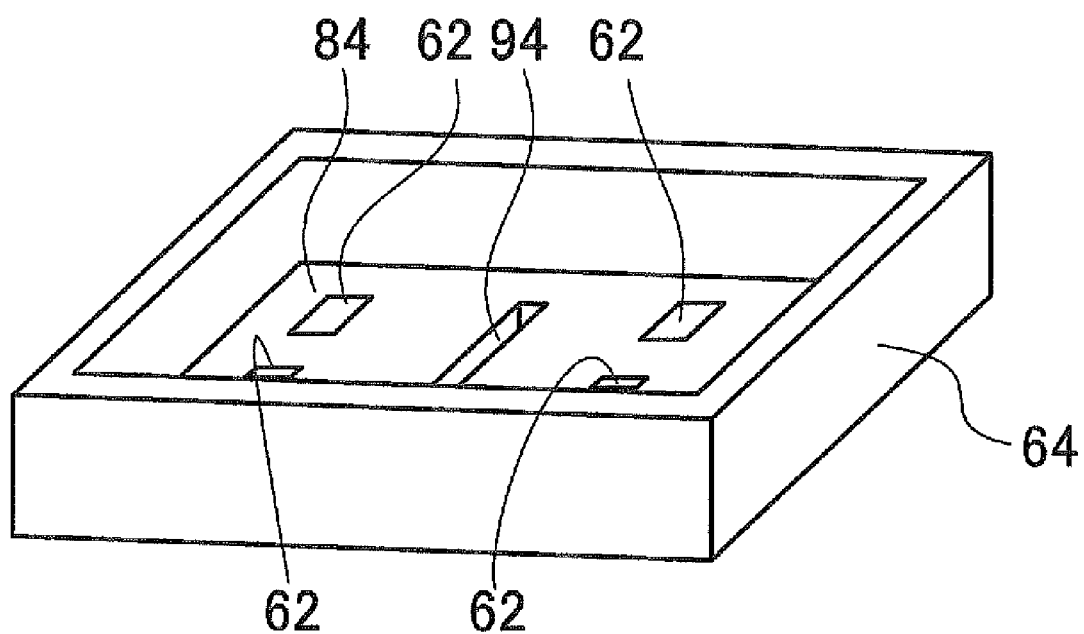
FIG. 16 is a diagram illustrating an example of a housing used for a method for manufacturing an oscillator device according to a modification of the fifth embodiment.

In the fifth embodiment, the housing 64 illustrated in FIG. 14A and FIG. 14B is used to manufacture the oscillator device 60 illustrated in FIG. 10. In the modification of the fifth embodiment, the housing 64 illustrated in FIG. 16 is used to manufacture the oscillator device 60 illustrated in FIG. 10. FIG. 16 is a perspective view illustrating the outer shape of the housing 64 according to the modification.

An intake/blast port 94 provided on the support substrate 84 in the housing 64 used for the modification is a slit-shaped opening longitudinal in one direction. The intake/blast port 94 is neither a hole opening penetrating through the support substrate 84 nor an opening of the conduit 88 connected to other openings as illustrated in FIG. 14B. The intake/blast port 94 is a concave slit-shaped opening.

The oscillator 65 is placed on a part of the intake/blast port 94 and a nozzle of the intake/blast device is placed on the remaining part of the intake/blast port 94 as described later.

FIGS. 17A to 17E are diagrams for explaining a method for manufacturing the oscillator device 60 according to the modification of the fifth embodiment.

At first, as illustrated in FIG. 17A, the oscillator 65 whose electrodes are provided on the main surface of the oscillator blank is placed on the support substrate 84 (see FIG. 16) as the bottom of the housing 64. The oscillator 65 is placed on the support substrate 84 to cover a part of the elongated slit-shaped intake/blast port 94 from above.

Thereafter, as illustrated in FIG. 17B, the remaining part of the intake/blast port 94 is covered up by a nozzle 96 of the intake/blast device 90. In this state, the intake by the nozzle 96 of the intake/blast device 90 allows the intake/blast port 94 to the intake state. Thus, the oscillator 65 is absorbed and held on the support substrate 84.

When the state is kept, the wire bonding is performed as illustrated in FIG. 17C, by wire bonders. For the wire bonding, the electrodes of the oscillator 65 are connected to the wires 68 and then the electrode pads 62 of the support substrate 84 of the housing 64 are connected to the wires 68.

After the wire bonding is finished, the intake/blast device 90 stops the intake state of the intake/blast port 94 and sets the intake/blast port 94 to the blast state as illustrated in FIG. 17D. The intake/blast port 94 is set to the blast state in this manner because the oscillator 65 is wire-bonded to the support substrate 84 in the absorbed state and thus the oscillator 65 may not move up and get suspended in air above the support substrate 84 by the wires 68 after the intake state of the intake/blast port 80 is stopped. Thus, the intake/blast port 94 is set to the blast state so that the oscillator 65 accurately moves up and gets suspended in air above the support substrate 84 as illustrated in FIG. 17E. In the modification, as illustrated in FIG. 17D, the intake/blast ports 94 is finally set to the blast state, but when the oscillator 65 moves up and get suspended in air above the support substrate 84 before the blast state, the intake/blast port 94 may not always be set to the blast state. However, the intake/blast port 94 is preferably set to the blast state for the oscillator 65 to accurately move up and get suspended in air above the support substrate 84.

In this manner, in the modification, the wire bonding is performed while the oscillator 65 is placed on the intake/blast port 94 of the support substrate 84 and the intake/blast port 94 is in the intake state to hold the oscillator 65 so that the oscillator 65 is held. Thereafter, the intake of the intake/blast port 94 is stopped. Thus, unlike the conventional manufacturing method, there are no complicated steps of bonding the oscillator by an adhesive and melting the adhesive, and thus the oscillator device 60 including the oscillator 65 suspended in air and floating above the support substrate as the bottom of the housing 64 can be easily and efficiently manufactured. Further, a failure does not occur that the adhesive remains in the closed space surrounded by the housing 64 and the top plate 67, which adversely affects the operation of the oscillator 65.

Furthermore, the intake state of the intake/blast port 94 is stopped and then the blast state is set so that the oscillator 65 can accurately move up and get suspended in air above the support substrate 84.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alternations could be made hereto without departing from the spirit and scope of the invention.

What is claimed is:

1. A method for manufacturing an oscillator device comprising an oscillator suspended in air above a substrate by use of wires, comprising:
    placing the oscillator provided with electrodes on a convex pedestal provided on an assembly table;
    arranging, on the assembly table, a frame member including an opening surrounded by a frame thereof and provided with electrode pads on the frame such that the opening is positioned at the pedestal;
    connecting the electrode pads to the electrodes of the oscillator placed on the pedestal via wires, while the frame member is arranged on the assembly table;
    removing the frame member from the assembly table together with the oscillator after the connecting, and
    bonding the frame member connected to the oscillator to a substrate.

2. The method for manufacturing an oscillator device according to claim 1, wherein a height of the electrodes of the oscillator placed on the pedestal from the assembly table is larger than a height of the electrode pads of the frame member from the assembly table, when the frame member is arranged on the assembly table.

* * * * *